United States Patent
Malolepszy et al.

(10) Patent No.: US 7,152,308 B2
(45) Date of Patent: Dec. 26, 2006

(54) WIREBONDER TO BOND AN IC CHIP TO A SUBSTRATE

(75) Inventors: Sean Michael Malolepszy, Sherman, TX (US); Peter J. Sakakinl, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 425 days.

(21) Appl. No.: 10/611,480

(22) Filed: Jul. 1, 2003

(65) Prior Publication Data

US 2004/0093725 A1 May 20, 2004

Related U.S. Application Data

(62) Division of application No. 10/060,517, filed on Jan. 30, 2002, now Pat. No. 6,602,726.

(51) Int. Cl.
*B23P 19/00* (2006.01)
(52) U.S. Cl. .............................. 29/740; 29/739; 29/832; 438/15
(58) Field of Classification Search .................. 29/832, 29/840, 854, 739, 740; 438/15
See application file for complete search history.

(56) References Cited

U.S. PATENT DOCUMENTS

| 3,868,765 | A | * | 3/1975 | Hartleroad et al. | .... 228/180.21 |
| 3,887,996 | A | * | 6/1975 | Hartleroad et al. | ......... 438/111 |
| 3,887,997 | A | * | 6/1975 | Hartleroad et al. | .... 228/180.21 |
| 3,887,998 | A | * | 6/1975 | Hartleroad et al. | ...... 228/123.1 |
| 3,919,146 | A | * | 11/1975 | Emmons | ................... 528/295.5 |
| 3,922,712 | A | * | 11/1975 | Stryker | ....................... 257/737 |
| 3,934,074 | A | * | 1/1976 | Evelove et al. | ............ 174/52.1 |
| 3,937,386 | A | * | 2/1976 | Hartleroad et al. | .... 228/180.21 |
| 3,960,279 | A | * | 6/1976 | Hartleroad et al. | ......... 414/590 |
| 5,118,300 | A | | 6/1992 | Zarreii | |

* cited by examiner

*Primary Examiner*—Carl J. Arbes
(74) *Attorney, Agent, or Firm*—Yingsheng Tung; Wade James Brady, III; Frederick J. Telecky, Jr.

(57) ABSTRACT

Thick film bond surfaces (8) on a support structure (10), such as a ceramic substrate or an IC package substrate, tend to deform during processing. A personality kit (16) having raised bosses (24) engages with and compresses the bond surfaces, resulting in a flatter, wider bond surface having improved reflectivity. The personality kit (16) is fit within a clamp (30) that can be used as a stand-alone unit or integrated into an existing machine, such as a wire bonder (46).

4 Claims, 5 Drawing Sheets

WIREBONDER TO BOND AN IC CHIP TO A SUBSTRATE

This is a divisional application of Ser. No. 10/060,517, filed Jan. 30, 2003, now U.S. Pat. No. 6,602,726.

FIELD OF THE INVENTION

This invention relates generally to integrated circuit manufacturing and more specifically to a wire-bonding step in the manufacture of an integrated circuit package.

BACKGROUND OF THE INVENTION

As illustrated in FIG. 1, an integrated circuit chip 2 is electrically connected to the outside world by connecting a wire 4 (typically called bond wire) from electrical contact points 6, commonly called bond pads, on the chip 2 to electrical contact points, commonly called bond surfaces, 8 on a physical support structure 10. Conductive traces 12 on the support structure then carry electrical signals to and from the chip to other components of the electrical circuit in which the chip is placed. Typically, the traces and bond surfaces are formed of a thick film when the support structure is, e.g., a ceramic substrate, which thick film is subject to heat in order to cure it. In applications where the support structure is a flexible film, thin films are more commonly employed for the conductive traces and bond surfaces.

The integrated support structure 10 may be a lead frame in some applications, which is subsequently encapsulated in a package, such as for instance, by being placed in an injection mold and surrounded by a plastic encapsulation that electrically insulates and environmentally protects the chip, forming an IC package. Electrical contact to the chip can be made via the lead frame, which extends beyond the package. The finished package is then mounted onto a circuit board to form part of a desired electrical circuit. In many applications, the lead frame comprises a thin, flexible film, such as polyemide, upon which is formed a thick film layer that is patterned to form the electrical traces 12. Ball grid array packages are a common example.

In other applications, the integrated circuit chip 2 is mounted directly onto the substrate or circuit board, without the need for a leadframe. In such an application, the circuit board itself provides the support structure 10. Typically, the circuit board is a ceramic substrate upon which a thick film is formed and patterned to form the electrical traces 12. One example of such an application is a multi-chip module in which several integrated circuit chips are mounted on a common substrate and connected together before being encapsulated. Another example is the commonly called hybrid circuit in which several integrated circuit chips are mounted directly onto a ceramic substrate (e.g., an alumina substrate) and electrically connected together by conductive traces 12 on the substrate forming support structure 10. Typically, the entire substrate is then encapsulated in order to electrically isolate and environmentally protect the integrated circuit chips.

Regardless of the application, the bond pads 6 on the chip must be electrically connected to bond surfaces 8 on the support structure. This is typically accomplished by connecting a thin wire, typically gold, between the bond pads and the bond surfaces, in a process referred to as wire bonding. In most applications, the bond wire is relatively thin, on the order of 15–33μ in diameter (although the teachings of the present invention is not limited by the size, type or composition of the bond wire). Typically, the wire is welded from the bond pad on the chip to a bond surface on the support structure in a process referred to as wire bonding. Any type of suitable bond may be made at either the bond pads or the bond surfaces, including ball bonds, stitch bonds, and the like. The weld is typically performed using well know techniques such as thermosonic, ultrasonic, compression, and the like. A ball bond may be used, for example, at the bond pad and a stitch bond may be used, for example, at the lead.

In many applications, the bond pads are also relatively small, on the order of 2 mils to 10 mils square, although the teaching of the present invention applies to larger as well as smaller bond surfaces. Likewise, the bond surface is also generally on the order of several mils in size. Because the conductive traces 12, including the bond surfaces 8, are commonly formed from a thick film, the bond surface of the bond surfaces (that is the surface to which the bond wire will be attached) is subject to deformation—particularly during the bake process by which the conductive traces are cured after being formed on the support structure 10. Materials such as gold, copper, nickel based alloys, aluminum, tungsten, copper-clad materials, and other well known alternatives are typically employed for the conductive traces and bond surfaces.

FIG. 2 illustrates in cross section a bond surface 8 that has deformed during the bake process. Note that, due to surface tension and shrinking, the top of the bond surface has taken on a pronounced radius of curvature and that as a result, the width of the bond surface has been reduced somewhat. Dotted lines 14 indicate the width of the lead surface 8 prior to shrinkage. As shown, the actual surface available for placement of a ball bond, stitch bond, or the like, is significantly reduced after shrinkage—in some instances the width shrinks to 90% or less of the pre-shrinkage surface area. In addition, the radius of curvature of the lead surface also provides a less ideal surface of bonding to than the ideal flat surface illustrated by dotted line 15. Both of these are deviations from the ideal bond surface, (i.e. shrinkage and radius of curvature) can result in the bond wire being mis-aligned to the bond surface or an incomplete or unsatisfactory bond between the bond wire and bond surface. Device failure, performance degradation, and reliability problems can result from such a situation.

In the past, device manufacturers have simply tried to minimize the effects of bond surface deformation through selection of the lead material and/or control over the heat processing of the device. This constraints limit the flexibility and adaptability of the manufacturing process, however. Other past attempts to correct the problem have involved an operator manually pressing down on individual bond surfaces with a tool to attempt to flatten the leads. This process is labor-intensive, time consuming, and subject to wide process variations; it is not a practical solution for high volume, inexpensive, high reliability manufacturing.

It has been known in the past to employ a clamping device to hold lead frames in place during, e.g., the wire bonding process. Lead frames, upon which the bond surface may be found, are typically small, thin components, generally metallic, and are typically in the form of small fingers extending from a central location near the chip outward to a surface to be connected to a circuit board. The lead frame fingers are subject to damage and misplacement during the bonding process. Commonly owned U.S. Pat. No. 6,322,659, issued Nov. 27, 2001 and entitled "System and Method for Dual Head Bonding," which patent is incorporated herein by reference, teaches such a method and apparatus for clamping lead frames in place during the bonding process.

Regardless of how lead frames are dealt with during the bonding process, what is needed is a method and apparatus that can quickly, reliably, and inexpensively condition a bond surface, particularly a thick film surface, to prepare the surface for reliable wire bonding. What is also needed is a method and apparatus that can be readily integrated into existing manufacturing processes.

SUMMARY OF THE INVENTION

The above shortcomings of the prior art are overcome and novel contributions to the art are provided by the preferred embodiments of the present invention. In one aspect, the invention provides for a method of conditioning the bond surfaces of a support structure by aligning the support structure within a clamp such that the bond surfaces on the support structure are aligned with raised boss surfaces on the clamp surface. The clamp is then brought into forcible contact with the support structure such that the raised boss surfaces on the clamp contact and compress the bond surfaces, resulting in a flattened bond surface. In the preferred embodiments, the clamp has a top element containing the raised bosses that engage the bond surfaces on the support structure and a bottom element that engages the bottom of the support structure. The bottom element may or may not have raised bosses, depending upon the particular application. In some embodiments, particularly embodiments employed with a non-flexible support structure, the bottom feature of the clamp may not be necessary. Heat and/or vibration, such as ultrasonic vibration, can be employed in some aspects of the invention, to make the bond surface more malleable. In some embodiments, the method occurs prior to the wire bonding operation. In other embodiments, the method is integrated into the wire bonding process step.

In another aspect, the present invention provides for a device for conditioning the bond surfaces of a substrate. The device includes a non-flexible member upon which if formed raised bosses. The raised bosses correspond to and align with bond surfaces on the substrate when the non-flexible member is brought into contact with a top surface of a substrate. The device may also include a second member that is brought into contact with a bottom surface of the substrate. In some embodiments, the present invention may provide for a heater coupled to the non-flexible member or the second member. In other embodiments, the invention may provide for a vibrator coupled to the non-flexible member or the second member.

In yet another aspect, the present invention provides for a bond surface conditioning machine including means for aligning a substrate to a conditioning clamp, means for forcibly engaging the substrate and the conditioning clamp such that raised features on the clamp forcibly engage with and flatter bond surfaces on the substrate, means for heating the bond surfaces, and means for attaching bond wires to the bond surfaces.

One advantage of the present invention is that yield and reliability in the manufacturing process can be improved by providing for flat, uniform bond surfaces.

Another advantage of the present invention is that the resulting bond surfaces tend to be smooth and reflective, thus allowing for improved recognition and alignment accuracy with, e.g., a machine vision system.

Yet another advantage of the present invention is that preferred embodiments can be realized as either a stand alone unit or can be incorporated into existing manufacturing process equipment, such as being incorporated into a conventional wire bonding machine with minimal retrofitting.

DETAILED DESCRIPTION OF THE PREFERRED EMBODIMENTS

Figure 1:
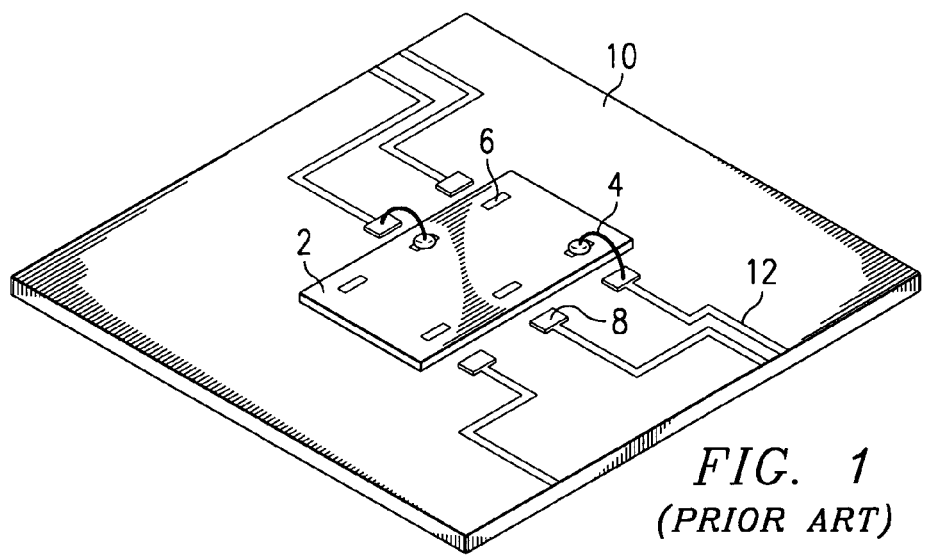
FIG. 1 illustrates in perspective view an integrated circuit chip wire bonded to a support structure.
Figure 3A:
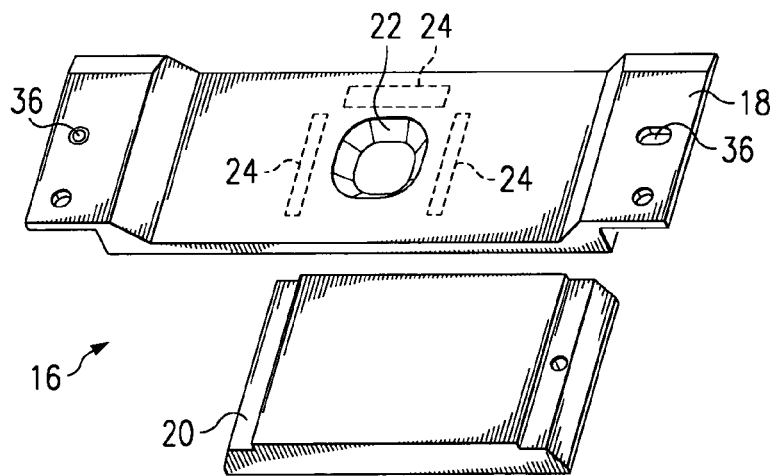
FIG. 3a illustrates a preferred embodiment personality kit employing features of the preferred embodiments of the invention.
Figure 3B:
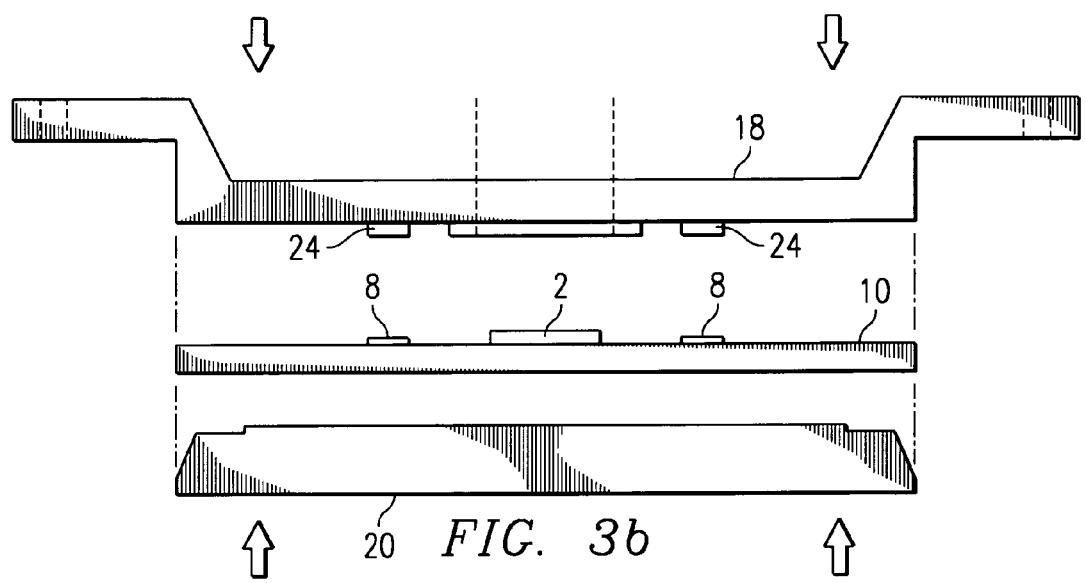
FIG. 3b illustrates in cross sectional view a preferred embodiment personality kit and support structure.

FIG. 3a illustrates a first preferred embodiment personality kit 16. In the first preferred embodiment, the personality kit comprises a top element or member 18 and a bottom element or member 20. This embodiment would be particularly useful for conditioning the bond surfaces of a thin, flexible support structure 10 (FIG. 1), such as a polyemide or similar substrate commonly employed in surface mount IC packages such a ball grid array (BGA) packages. FIG. 3b illustrates the personality kit 16 in cross section as used with a support structure 10. As shown in FIG. 3b, the support structure 10, including an IC chip 2 mounted thereon, and thick film bond surfaces 8 formed thereon, is positioned between top member 18 and bottom member 20. Top member 18 preferably has a cavity 22 formed therein, which cavity 22 is aligned with chip 2, so as not to disturb chip 2 when top member 18 is brought into contact with support structure 10. In other embodiments, the bond conditioning method discussed herein can be applied to bond surfaces 8 prior to the placement of IC chip on the support structure 10. In those embodiments, cavity 22 would not be required.

Figure 3C:
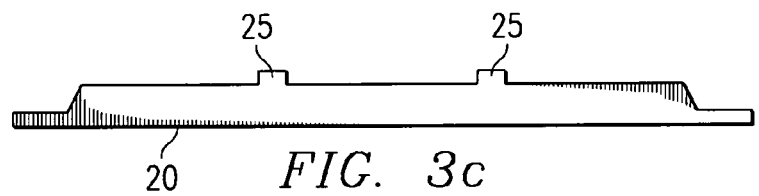
FIG. 3c illustrates an alternative embodiment personality kit member.

Top member 18 also has a series of raised surfaces, or bosses 24, located on its bottom surface. These bosses 24 are shown in phantom line in the perspective view of FIG. 3a and some of them are shown in the cross sectional view of FIG. 3b. As will be discussed in further detail below, these bosses 24 come into contact with and compress the bond surfaces 8 in order to flatten and condition the bond surfaces surface. As best illustrated in FIG. 3b, each boss 24 is aligned with one or more bond surfaces 8 on the support structure 10. In some embodiments, bottom member 20 has corresponding bosses 25 as illustrated in FIG. 3c.

In operation, support structure 10 is placed between top member 18 and bottom member 20 with the bond surfaces 8 being aligned with the bosses 24, as shown in FIG. 3b. Top member 18 is then lowered and bottom member 20 is raised, so as to contact and compress the support structure 10. Particularly, because the bosses are raised features, the bosses will contact the bond surfaces 8 and compress them slightly. Bottom member 20 provides an inflexible base to ensure that support structure 10 (which as described above may be a thin, flexible film) does not bend or deform. It should be noted that both top member 18 and bottom member 20 are preferably formed of rigid, non-flexible material to ensure that the members will engage with the support structure 10 and bond surfaces 8 in a substantially flat uniform surface. This ensures that every bond surface 8 is compressed uniformly and with equal compression. Preferably, the personality kit members are formed of industrial grade metal, such as a 440C stainless steel or comparable material. Rigid ceramics could also be employed for the members. As discussed below, however, in some embodiments, top member 18 or bottom member 20 is heated prior to or during the compression step in order to heat the bond surfaces 8. In such embodiments, the members should be formed of a heat conducting material. After the bond surfaces 8 have been conditioned by applying compression for a pre-determined time, members 18 and 20 are opened, and support structure 10 can thereafter be removed for further processing, such as for wire bonding. One of ordinary skill in the art will recognize that the amount of compressive force and the time duration of compression will depend upon the material forming bond surfaces 8, as well as the material forming support structure 10, as routine experimentation and design choice. Additionally, the temperature at which the compression operation takes place (i.e. whether the bond surfaces 8 or the members 18 or 20 are heated prior to or during the operation) can affect the time duration required to condition the bond surfaces. Other factors, such as whether ultrasonic or thermosonic vibration is applied, can also impact the optimal compression force and time duration, as will be readily appreciated by one of ordinary skill in the art.

Figure 2A:
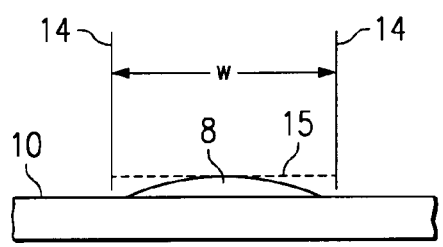
FIGS. 2a and 2b illustrates in cross section view a bond surface on a support structure.
Figure 2B:
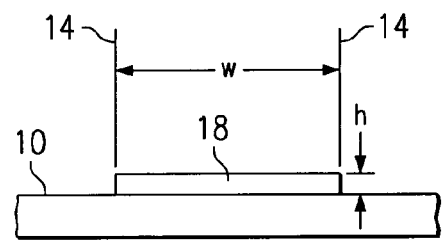

FIG. 2b illustrates in cross sectional view a bond surface 8 after it has been conditioned by being compressed in personality kit 16. Note that, in contrast to FIG. 2a, the bond surface 8 surface is now substantially flat. Note also that by flattening out the bond surface, the width of the bonding surface has been increased back to the design size w. Additionally, the bond surfaces 8 on the support structure 10 will have a substantially uniform height h after conditioning. This can be advantageous in subsequent wire bonding operations. Another advantageous feature of the conditioned bond surface is that the bond surface will tend to be smooth and shiny. This provides for improved reflectivity, which can be advantageous in the subsequent wire bonding operations (particularly when such operations involve machine vision).

Figure 4:
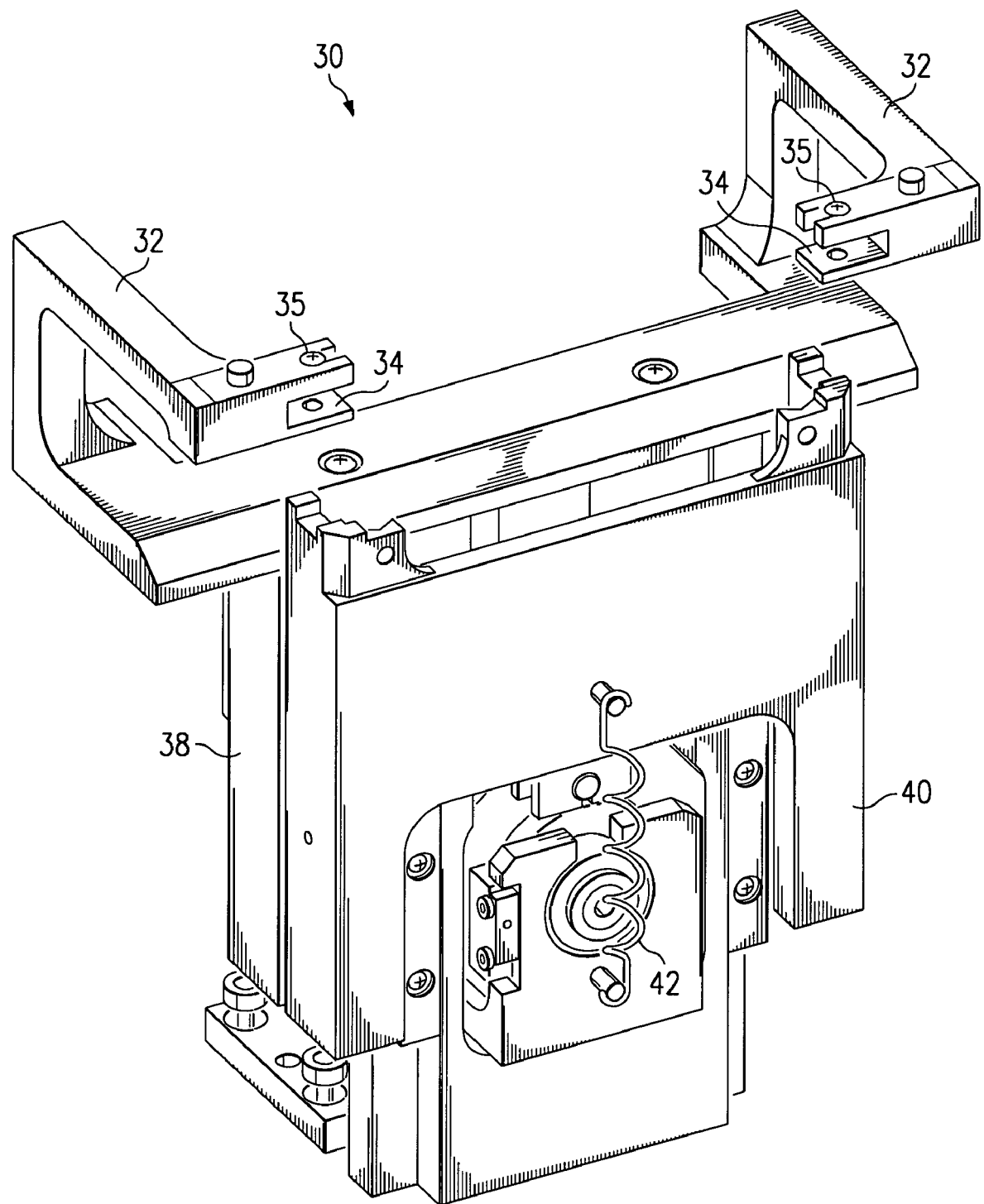
FIG. 4 schematically illustrates a clamp mechanism employing features of the present invention.

FIG. 4 illustrates a preferred embodiment clamp 30 in which personality kit 16 may be employed. The clamp 30 includes to unshaped arms 32 which terminate with slots 34. Slots 34 receive the ends of upper member 18. Pins 35, located on the ends of arms 32 can be inserted through holes 36 provided in upper member 18 (FIG. 3a) in order to secure the upper member securely into the clamp. Arms 32 are connected to a movable base 38, which base can move relative to a second movable base 40. Personality kit lower member 20 is attached to the second movable base 40. In operation, base 40 will drive lower member 20 upwards while base 38 drives arms 32 and hence upper member 18 downwards to engage with and compress the support structure (not shown in FIG. 4). This motion is accomplished by a drive and cam mechanism 42, the details of which are not necessary for an understanding of the invention.

In the preferred embodiment, clamp 30 also includes a heater block element (not shown) is attached to base 40 and to which is attached lower member 20. The heater block element serves to head lower member 20, which then transfers the heat to the bond surfaces 8 during the compression step. This heating of the bond surfaces allows for the bond surface material (typically gold, copper, nickel, tungsten, aluminum, or some other commonly employed conductive film) to be more malleable and deformable without excessive compression. Heating the material also lessens the chances of cracks forming in the bond surface material.

As one skilled in the art will recognize, clamp 30 can be driven in a variety of different manners to provide the movement of and compression between upper and lower members 18, 20 of the personality clamp 16. Preferably, a servomotor is employed to drive bases 38 and 40, in order to allow for precise movement and for precise control over the amount of compressive force applied to the bond surfaces. Other motor drives, including linear motors, stepper motors, and the like could be employed, as could cam driven pulleys, or pneumatic or hydraulic drive systems.

Figure 5:
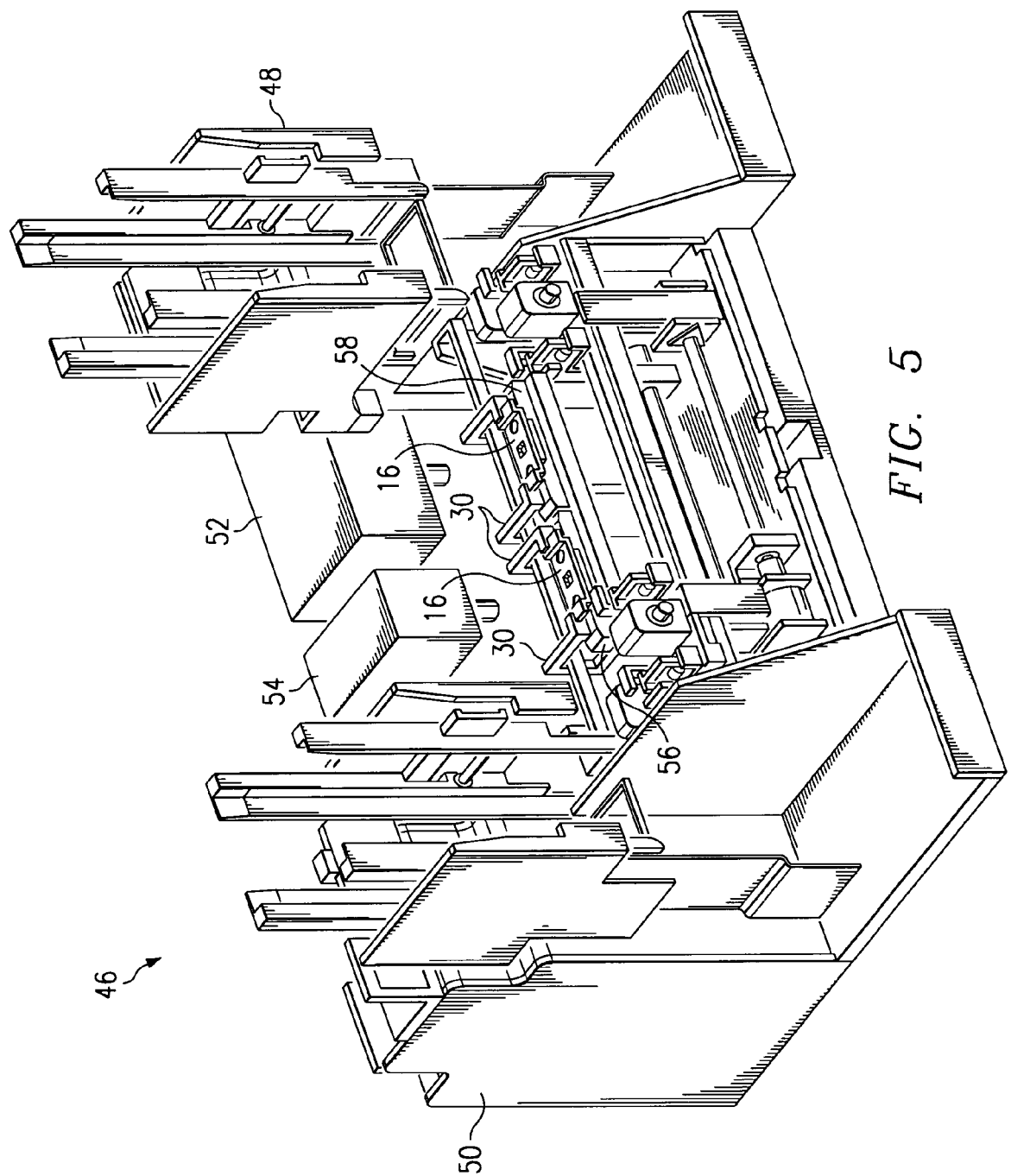
FIG. 5 schematically illustrates a wire bonding machine in which preferred embodiments of the present invention may be employed.

A wire bonding machine 46 employing preferred embodiments of the present invention is illustrated in FIG. 5. The machine illustrated in FIG. 5 is configured to operate in duplex mode, i.e. two devices can be operated upon in parallel. To this end, machine 46 includes a first elevator 48 in which a first group of devices to be operated upon can be loaded and a second elevator 50 in which a second group of devices to be operated upon can be loaded. One skilled in the art will recognize that machine 46 provides hardware and control circuitry and software to position devices (such as support structures 10) from the elevators 48 and 50 and position the devices under bond capillaries 52 and 54, respectively. Although illustrated schematically for clarity, one skilled in the art will recognize that bond capillaries 52, 54 entail numerous details for indexing and positioning the bond capillaries over the devices to be bonded, as well as for feeding through the bond wire, attaching the bond wire to the appropriate contacts on the IC chip and support structure, and the like. These details are omitted for clarity and are not necessary to an understanding of the invention.

Because bonding machine 46 preferably operates on two devices in parallel, two clamps 30 are illustrated. Each claim holds a personality kit 16, the top member 18 of which can be seen in FIG. 5. The bottom member 20 is obscured in the perspective view of FIG. 5. Also shown in FIG. 5 are mounting blocks 56 and 58. As described above, these mounting blocks may include heating elements that heat bottom member 20 of personality kit 16, which heat is transferred to the bond surfaces 8 during the compression operation. In alternative embodiments, blocks 56 and 58 may provide the additional or alternative function of providing ultrasonic vibration to the clamp, and hence to the bond surfaces to be conditioned. The blocks 56 and/or 58 can be driven by a piezo-eletric device, a linear or voice coil motor, or the like, configured to provide vibrations at the desired frequency range, as will be apparent to one skilled in the art. As discussed above, ultrasonic vibrations, in addition to or perhaps in lieu of heat, will make the bond surface material more malleable and deformable and hence more susceptible to conditioning.

The teachings of the present invention apply equally to more typical single head bonding machines as well, in which case a single clamp and personality kit would be employed. Alternatively, a dual-head bonding machine could be employed, in which one head performs bond surface conditioning and the other head performs the bonding operation. One skilled in the art will recognize that the teachings of the present invention also apply to a stand-alone machine that only performs the bond surface conditioning steps described above. Or the bond surface conditioning process described above could be incorporated into some other machine typically employed in the integrated circuit chip assembly process flow.

While the preferred embodiments have been described with reference to wire bonding operations, one skilled in the art will recognize the applicability of the present invention to numerous processes for interconnecting an integrated circuit chip to a substrate. Alternative approaches to the interconnect include flip chip process, tab connection processes, bump bonds, conductive layer interconnects, and the like. The teachings of the present invention will apply to any interconnect scheme in which it is desired to condition an interconnect surface for improved electrical and physical connection, and preferably for improved visual recognition by a machine, or the like. Therefore, the term bond surface should be broadly construed to include any manner of interconnect surface.

Figure 6A:
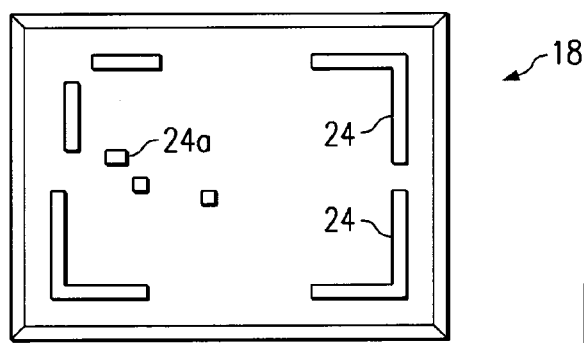
FIGS. 6a and 6b illustrate an alternative preferred embodiment personality kit used in conjunction with a ceramic substrate.
Figure 6B:
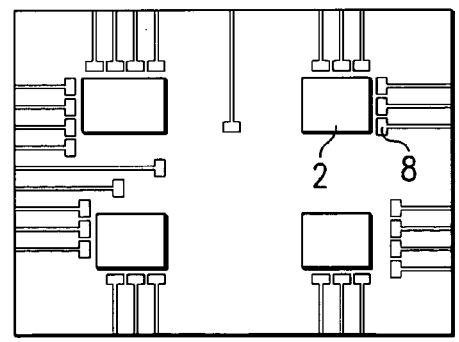

Another embodiment personality kit 16 is illustrated in FIG. 6a. This embodiment is preferably with a support structure 10 such as illustrated in FIG. 6b, which support structure is a ceramic substrate upon which are placed one or more integrated circuit chips 2. Because the ceramic structure is rigid and inflexible, it is not necessary to have a bottom element 20 in this embodiment. The bottom surface of the top member 18 is shown in FIG. 6a. Eight bosses 24 are illustrated. These bosses align with the various bond surfaces illustrated in FIG. 6b. Note that one raised boss 24 can correspond to multiple different bond surfaces or bond sites. In other instances, a single boss, such as boss 24a of FIG. 6a will correspond to and contact only a single bond site.

Note also that no cavities 22 are shown for personality kit 16 member 18. This is because this embodiment is intended to be used prior to the chips 2 being mounted on the substrate 10. This highlights the fact that the bond surface conditioning methods and apparatus discussed above can be used either concurrently with wire bonding operations, or is a separate, prior process step. One skilled in the art will recognize that the personality kit described above can be used as a stand-alone unit (preferably in combination with a clamp 30) or can be incorporated into a special purpose machine or integrated into a machine having a different primary purpose, such as the wire bonder 46 illustrated in FIG. 5 and described above.

Figure 7A:
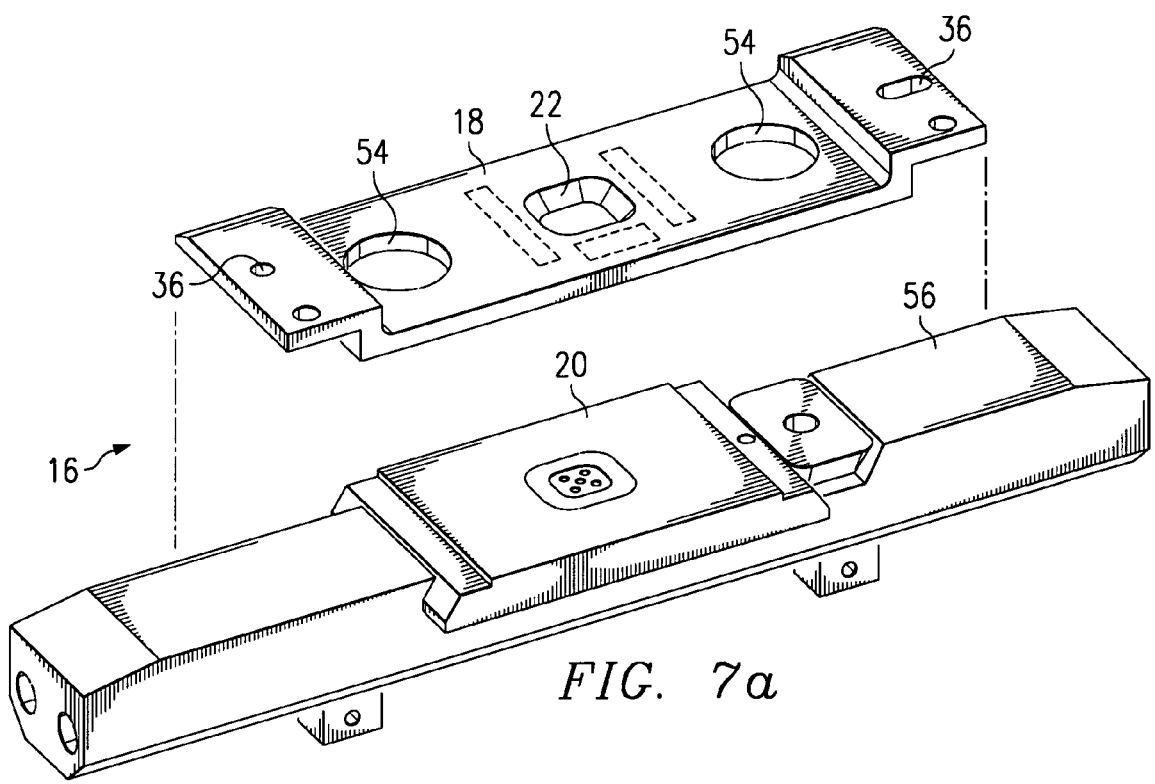
FIGS. 7a and 7b illustrate yet additional alternative preferred embodiment personality kits in which features of the present invention may be employed.
Figure 7B:
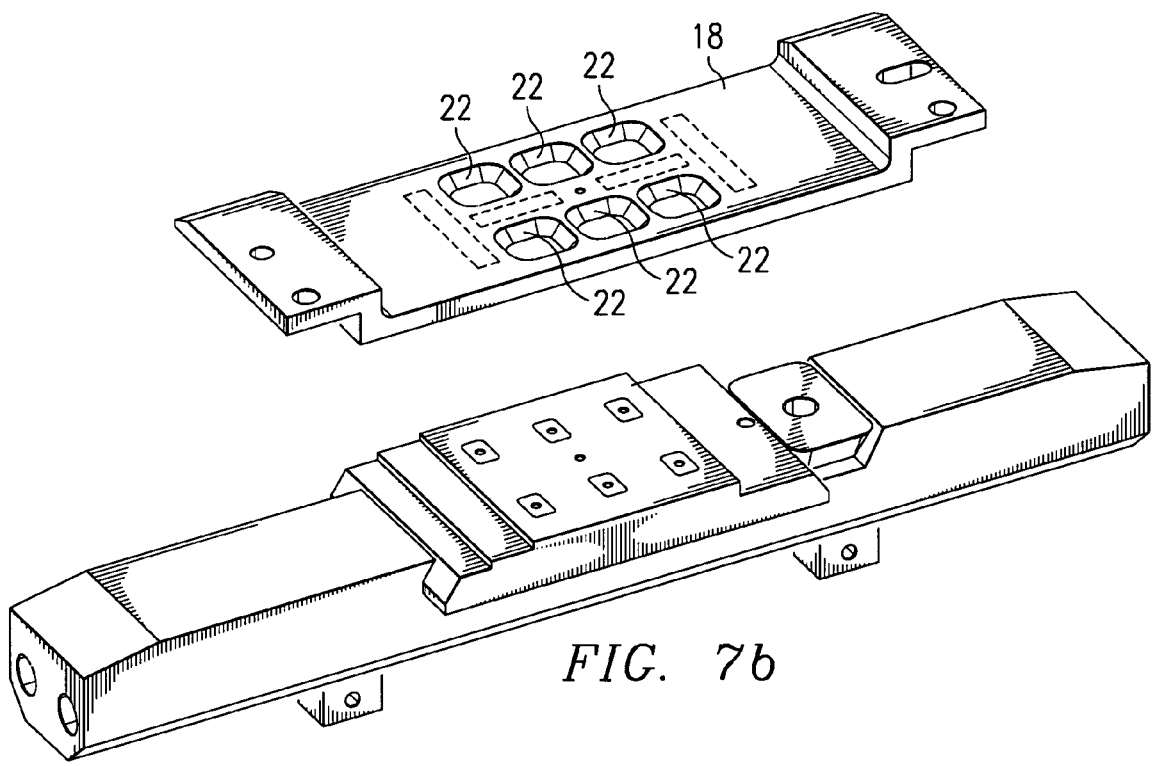

FIG. 7a illustrates an exemplary personality kit 16, with its bottom member 20 mounted on an exemplary block 56. As described above, block 56 can include a heating element or a vibrating element to provide for thermal or ultrasonic treatment of the device clamped within the personality kit 16. Top member 18 has only a single cavity 22 for receiving therein an integrated circuit chip, although it may have additional cavities 54 for securing the kit to a clamp or machine, alignment purposes, or the like. With reference to FIG. 7b, an alternative personality kit 16 is illustrated in which top element 22 has multiple cavities 22. In the illustrated embodiment, six such cavities 22 are shown, although one skilled in the art will recognize the number, size, and placement of the cavities are a matter of design choice. The embodiment illustrated in FIG. 7b allows for conditioning the bond surfaces of a substrate upon which has been placed several integrated circuit chips. Note that sufficient spacing between cavities 22 must be maintained in order to allow for the formation of bosses 24 between the cavities. Because the integrated circuit chips 2 will presumably be spaced sufficiently far apart on substrate 10 to allow for bond surfaces to be formed between the chips, this limitation should not be a problem. Whereas a single cavity 22 is shown for receiving each chip, one or more cavities 22 could be made large enough to accommodate several chips therein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A wirebonder adapted to wire bond an integrated circuit chip to a substrate, the substrate having formed thereon a plurality of conductive traces, at least one of the conductive traces having a bond region containing a bond surface, the machine comprising:
   a support structure positioning device;
   a conditioning device positioned adjacent the support structure positioning device, the conditioning device and the support structure being movable relative to one another in a direction normal to the support structure, the conditioning device comprising:
   a member;
   a raised boss on the member, the raised boss being configured to compress bond surfaces on a top surface of the support structure when the conditioning device is engaged with the support structure;
   a cavity located so as to receive therein an integrated circuit chip mounted on said support structure when the flexible member is engaged with the support structure; and
   a bond wire capillary positioned over the circuit board clamp.

2. The machine of claim 1 further comprising a heater connected to the conditioning device.

3. The machine of claim 1 further comprising a vibrator connected to the conditioning device.

4. The machine of claim 1 further comprising a servo motor attached to the conditioning device, the servo motor moving the conditioning device relative the support structure positioning device.

* * * * *

UNITED STATES PATENT AND TRADEMARK OFFICE
CERTIFICATE OF CORRECTION

| | | |
|---|---|---|
| PATENT NO. | : 7,152,308 B2 | |
| APPLICATION NO. | : 10/611480 | |
| DATED | : December 26, 2006 | |
| INVENTOR(S) | : Sean M. Malolepszy et al. | |

It is certified that error appears in the above-identified patent and that said Letters Patent is hereby corrected as shown below:

Title page, item [75] inventor: should read --Sakakini--

Signed and Sealed this

Sixth Day of May, 2008

JON W. DUDAS
*Director of the United States Patent and Trademark Office*